United States Patent
Sakai et al.

(10) Patent No.: US 10,656,408 B1
(45) Date of Patent: May 19, 2020

(54) ELECTROWETTING DISPLAY DEVICE WITH INTEGRATED PIXEL SPACER

(71) Applicant: Amazon Technologies, Inc., Seattle, WA (US)

(72) Inventors: Toru Sakai, Waalre (NL); Abhishek Kumar, Tilburg (NL); Jacco van der Gaag, Mierlo (NL)

(73) Assignee: AMAZON TECHNOLOGIES, INC., Seattle, WA (US)

( * ) Notice: Subject to any disclaimer, the term of this patent is extended or adjusted under 35 U.S.C. 154(b) by 755 days.

(21) Appl. No.: 15/251,964

(22) Filed: Aug. 30, 2016

(51) Int. Cl.
  *G02B 26/00* (2006.01)
  *H05K 1/09* (2006.01)

(52) U.S. Cl.
  CPC ............. *G02B 26/005* (2013.01); *H05K 1/09* (2013.01); *G02B 2207/115* (2013.01); *H05K 2201/0323* (2013.01); *H05K 2201/0326* (2013.01); *H05K 2201/0329* (2013.01); *H05K 2201/10128* (2013.01)

(58) Field of Classification Search
  CPC .......... G02B 26/005; G02B 26/00–289; G02B 2207/115; G02B 26/004; H05K 1/09; H05K 2201/0323; H05K 2201/0326; H05K 2201/0329; H05K 2201/10128
  USPC ........................................................ 359/633
  See application file for complete search history.

(56) References Cited

U.S. PATENT DOCUMENTS

| | | | | |
|---|---|---|---|---|
| 7,215,404 B2* | 5/2007 | Chun | ................... | G02F 1/13394 349/155 |
| 8,885,243 B2* | 11/2014 | Kwon | ................... | G02B 26/005 359/290 |
| 9,684,161 B1* | 6/2017 | Langendijk | .......... | G02B 26/005 |
| 2009/0059348 A1* | 3/2009 | Niwano | ............... | G02B 26/004 359/296 |
| 2009/0195850 A1* | 8/2009 | Takahashi | ............ | G02B 26/004 359/226.3 |
| 2013/0141405 A1* | 6/2013 | Huitema | ............... | G02B 26/005 345/205 |
| 2013/0242367 A1* | 9/2013 | Cho | ...................... | G02B 26/005 359/228 |
| 2013/0301105 A1* | 11/2013 | Kim | ...................... | G02B 26/005 359/290 |
| 2014/0029080 A1* | 1/2014 | Hwang | ................ | G02B 26/005 359/290 |
| 2014/0036341 A1* | 2/2014 | Kwon | ................... | G02B 26/005 359/290 |

* cited by examiner

*Primary Examiner* — William R Alexander
(74) *Attorney, Agent, or Firm* — Quarles and Brady LLP

(57) ABSTRACT

An electrowetting display device includes a first support plate and a plurality of pixel walls on the first support plate. The plurality of pixel walls are associated with an electrowetting pixel. A pixel electrode is on the first support plate for applying a voltage within the electrowetting pixel. The device includes a second support plate over the first support plate, an organic layer on the second support plate, and an electrode layer on the organic layer. The electrode layer is patterned to include an opening. A pixel spacer is coupled to the second support plate. The pixel spacer includes a first portion in direct contact with the organic layer through the opening in the electrode layer. The pixel spacer is in contact with at least one pixel wall in the plurality of pixel walls.

20 Claims, 10 Drawing Sheets

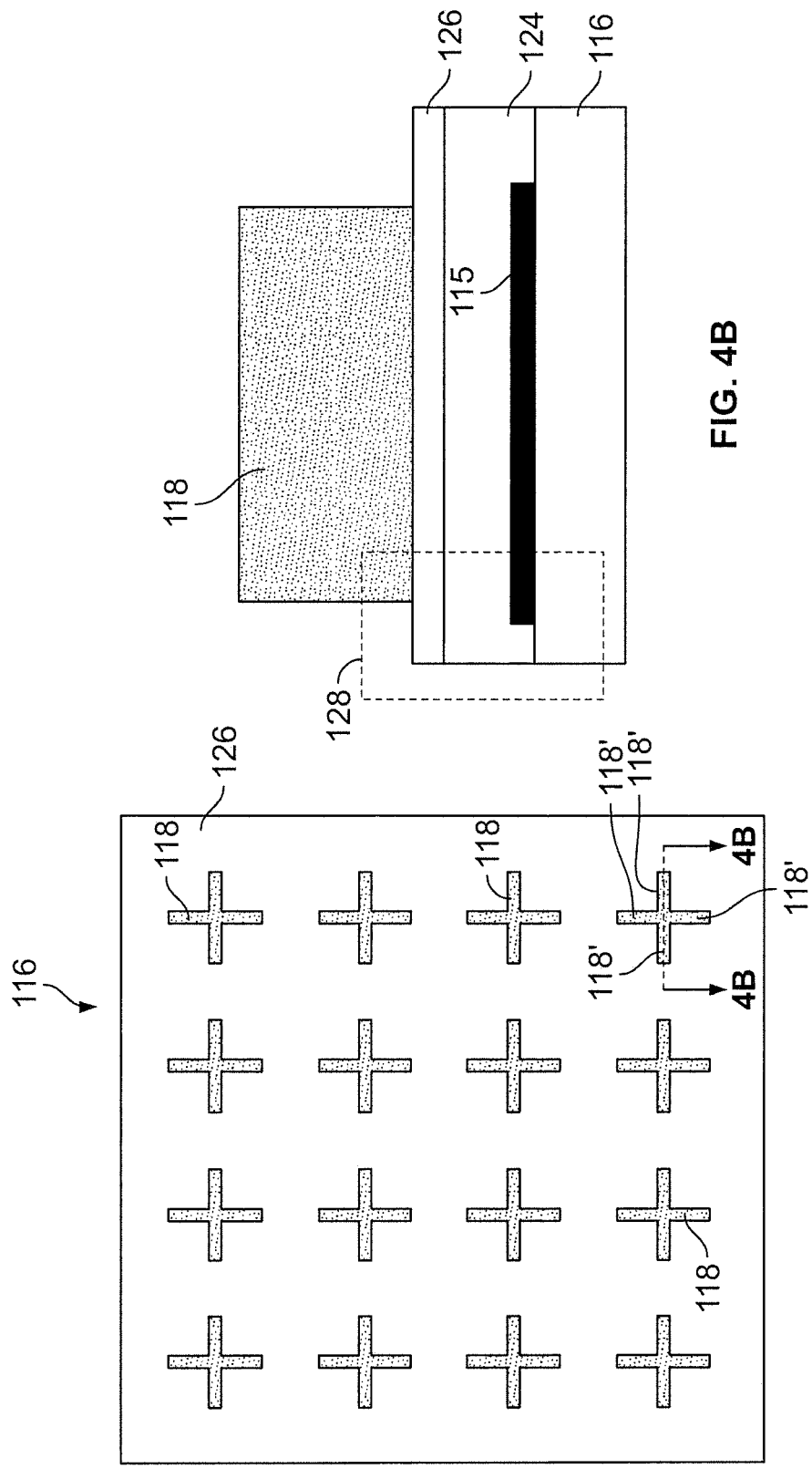

ELECTROWETTING DISPLAY DEVICE WITH INTEGRATED PIXEL SPACER

BACKGROUND

Electronic displays are found in numerous types of electronic devices including, without limitation, electronic book ("eBook") readers, mobile phones, laptop computers, desktop computers, televisions, appliances, automotive electronics, and augmented reality devices. Electronic displays may present various types of information, such as user interfaces, device operational status, digital content items, and the like, depending on the kind and purpose of the associated device. The appearance and quality of a display may affect a user's experience with the electronic device and the content presented thereon. Accordingly, enhancing user experience and satisfaction continues to be a priority. Moreover, increased multimedia use imposes high demands on designing, packaging, and fabricating display devices, as content available for mobile use becomes more extensive and device portability continues to be a high priority to the consumer.

An electrowetting display includes an array of pixels individually bordered by pixel walls that retain fluid, such as an opaque oil, for example. Light transmission through each pixel is adjustable by electronically controlling a position of the fluid in the pixel.

BRIEF DESCRIPTION OF THE DRAWINGS

The detailed description is set forth with reference to the accompanying figures. The use of the same reference numbers in different figures indicates similar or identical items or features.

FIG. 4A is a bottom view of a top support plate including an electrode layer and a number of pixel spacers mounted directly to the electrode layer.

FIG. 4B depicts a cross sectional view of a portion of the top support plate taken along sectional line 4B-4B of FIG. 4A.

DETAILED DESCRIPTION

Figure 1A:
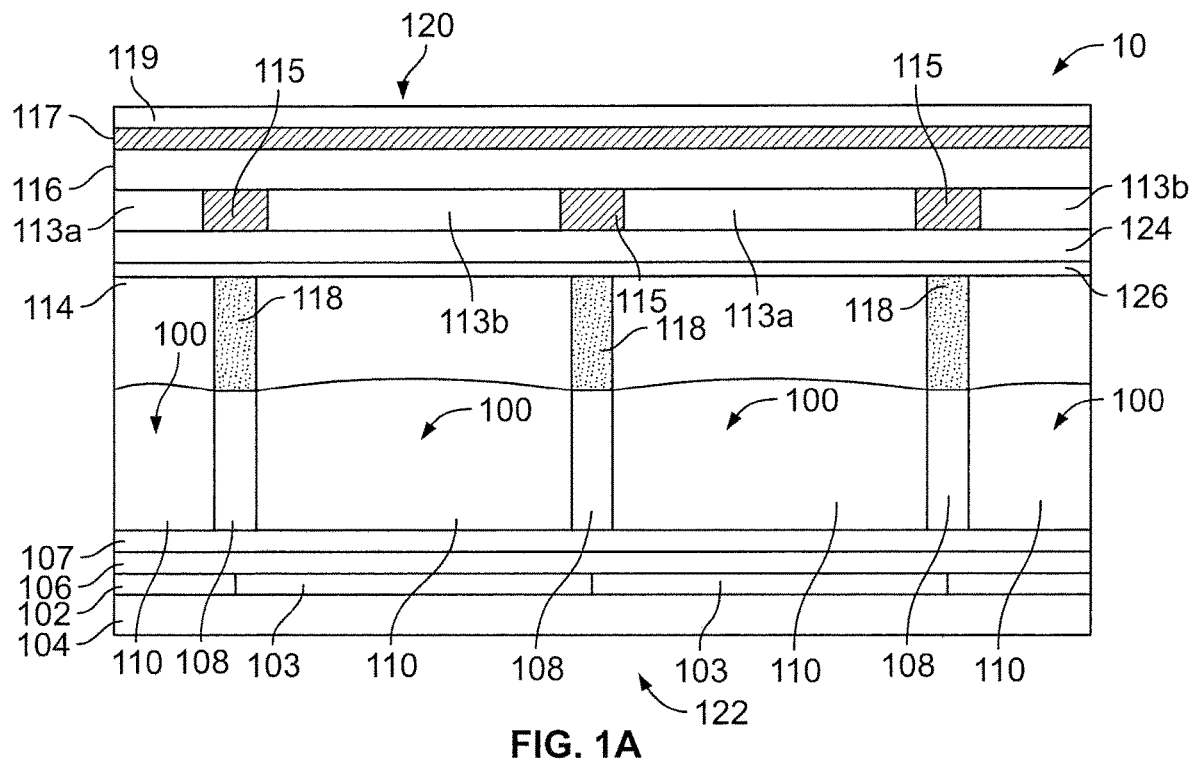
FIGS. 1A and 1B illustrate cross-sectional views of a portion of an electrowetting display device.

In various embodiments described herein, electronic devices include electrowetting displays for presenting content and other information. In some examples, the electronic devices may include one or more components associated with the electrowetting display, such as a touch sensor component layered atop the electrowetting display for detecting touch inputs, a front light or back light component for lighting the electrowetting display, and a cover layer component, which may include antiglare properties, antireflective properties, anti-fingerprint properties, anti-cracking properties, and the like.

An electrowetting display includes a number of electrowetting pixels. Within the display, each electrowetting pixel is associated with a number of pixel walls. The pixel walls form a structure that is configured to contain at least a portion of a first fluid, such as a black opaque oil. Light transmission through the electrowetting pixels can be controlled by an application of an electric potential or driving voltage to the electrowetting pixels, which results in a movement of a second fluid, such as an electrolyte solution, into or within the electrowetting pixels, thereby displacing the oil.

When an electrowetting pixel is in a rest state (i.e., with no driving voltage applied or at a driving voltage that falls below a threshold value causing the electrowetting pixel to be inactive), the oil is distributed throughout the pixel. The oil absorbs light and the pixel in this condition appears black. But when the driving voltage is applied, the oil is displaced to one or more sides of the pixel. Light can then enter the electrowetting pixel striking a reflective surface at the bottom of the pixel. The light then reflects out of the pixel, causing the pixel to appear less dark (e.g., white) to an observer. If the reflective surface only reflects a portion of the spectrum of visible light or if color filters are incorporated over the pixel, the pixel may appear to have color. The degree to which the oil is displaced from the oil's resting position affects the overall reflectance of the pixel—the pixel's capability to reflect or transmit light—and, thereby, the pixel's appearance or brightness. By manipulating the driving voltage applied to the electronic device's electrowetting pixels, different images can be depicted on a display surface of the electronic device.

Electrowetting displays include an array of electrowetting pixels sandwiched between two support plates, such as a bottom support plate and a top support plate. The electrowetting pixels include various layers of materials built upon the bottom support plate, including a fluoropolymer layer, around portions of which the pixel walls are constructed. The top support plate is then mounted over the bottom support plate to enclose a volume containing the oil. The top support plate and the bottom support each include electrode layers that operate in combination to subject the electrowetting pixels to various driving voltages, resulting in oil displacement.

To provide for accurate positioning of the top support plate with respect to the bottom support plate and for physical support of the top support plate, a number of pixel spacers may be attached to the top support plate. With the top support plate mounted over the bottom support plate, the pixel spacers of the top support plate rest upon the pixel walls that are formed on the bottom support plate. The pixel spacers can then provide physical support to the top support plate and also can provide that the top support plate is held a minimum distance away from the bottom support plate.

In conventional display devices, the pixel spacers are mounted directly to the top support plate's electrode layer. During fabrication of the pixel spacers, pixel spacer material is first deposited on the electrode layer and then cured to form the pixel spacers. During curing, however, the pixel spacer material can shrink. This can result in shear forces being generated between the pixel spacer material and the electrode layer. In some cases, these shear forces can cause the electrode layer to crack or otherwise become distorted. The cracks in the electrode layer can result in visual artifacts that may be noticed by a viewer of the display device.

In the present system, the electrode layer of the top support plate includes a number of openings. The pixel spacers, or at least a portion of the pixel spacers, are then formed over the openings in the electrode layer in direct contact with the organic layer located behind the electrode layer of the top support plate. The organic layer can be more physically robust than the electrode layer. And, as such, by mounting the pixel spacers directly to the organic layer rather than the electrode layer, the cracking of the electrode layer during curing of the pixel spacers can be avoided or at least reduced as compared to conventional designs.

Generally, the shear forces created between the pixel spacers and the top support plate's electrode layer are greatest around particular regions of the pixel spacers. For example, in pixel spacers that include relatively narrow portions, such as legs or extensions, the shear forces may be greatest along those narrow portions. Accordingly, in some embodiments, the openings in the electrode layer may only be located under a portion of the extensions of the pixel spacers, with the remaining portions of the pixel spacers being mounted to the electrode layer. Even so, in such a configuration the likelihood of crack formation in the electrode layer during curing of the pixel spacers may be reduced because the pixel spacer's extensions are mounted directly to the organic layer, rather than the electrode layer.

Hereinafter, example embodiments include, but are not limited to, reflective electrowetting displays that include a clear, transparent, or semi-transparent top support plate and a bottom support plate, which need not be transparent. The clear top support plate may comprise glass or any of a number of transparent materials, such as transparent plastic, quartz, and semiconductors, for example, and claimed subject matter is not limited in this respect. "Top" and "bottom" as used herein to identify the support plates of an electrowetting display do not necessarily refer to a direction referenced to gravity or to a viewing side of the electrowetting display. Also, as used herein for the sake of convenience of describing example embodiments, the top support plate is that through which viewing of pixels of a (reflective) electrowetting display occurs.

A display device, such as an electrowetting display device, may be a transmissive, reflective or transflective display that generally includes an array of pixels configured to be operated by an active matrix addressing scheme. In this disclosure, a pixel may, unless otherwise specified, comprise a single sub-pixel or a pixel that includes two or more sub-pixels of an electrowetting display device. Such a pixel or sub-pixel may be the smallest light transmissive, reflective or transflective element of a display that is individually operable to directly control an amount of light transmission through and/or reflection from the element. For example, in some implementations, a pixel may be a red sub-pixel, a green sub-pixel, a blue sub-pixel or a white sub-pixel of a larger pixel or may, in some cases, include a number of sub-pixels. As such, a pixel may be a pixel that is a smallest component, e.g., the pixel does not include any sub-pixels.

Rows and columns of electrowetting pixels are operated by controlling voltage levels on a plurality of source lines and gate lines. In this fashion, the display device may produce an image by selecting particular pixels to transmit, reflect or block light. Pixels are addressed (e.g., selected) via rows and columns of the source lines and the gate lines that are electrically connected to transistors (e.g., used as switches) associated with each pixel. The transistors take up a relatively small fraction of the area of each pixel to allow light to efficiently pass through (or reflect from) the display pixel.

In some embodiments, a reflective electrowetting display comprises an array of pixels sandwiched between a bottom support plate and a top support plate. The bottom support plate may be opaque while the top support plate is transparent. Herein, describing a pixel or material as being transparent generally means that the pixel or material may transmit or enable the propagation of a relatively large fraction of the light incident upon it. For example, a transparent material or layer may transmit or propagate more than 70% or 80% of the light impinging on its surface, though claimed subject matter is not limited in this respect. In contrast, opaque generally means that the pixel or material may block or inhibit the transmission or propagation of at least a portion of the visible light spectrum incident upon it. For example, a black opaque material or layer may block, absorb, or otherwise prevent the propagation of more than 70% or 80% of the light impinging on its surface, though claimed subject matter is not limited in this respect. In the present disclosure, materials that are described as preventing the propagation of light shall be understood to prevent propagation of at least 70% of the light striking the material. Alternatively, opaque material may be transmissive for a portion of the visible light spectrum and blocking other portions, forming a color filter. Similarly, materials that are described as being transparent or allowing propagation of light shall be understood to transmit or propagate at least 70% of the light striking the material. In this description, the visible light spectrum may include light having a wavelength between 390 nanometers (nm) and 700 nm.

Pixel walls retain at least a first fluid that is electrically non-conductive in the individual pixels. For example, the first fluid may include an opaque or colored oil. References in the present disclosure to an oil shall be understood to refer to any fluid that is electrically non-conductive. Each pixel includes a cavity formed between the support plates that is at least partially filled with the oil (e.g., retained by pixel walls) and a second fluid (e.g., considered to be an electrolyte solution) that is electrically conductive or polar and may be a water or a salt solution such as a solution of potassium chloride water. The second fluid may be transparent, but may be colored, or light-absorbing in some embodiments. The second fluid is immiscible with the first fluid. Herein, substances are immiscible with one another if the substances do not substantially form a solution.

Individual reflective electrowetting pixels may include a reflective layer on the bottom support plate of the electrowetting pixel, a transparent electrode layer adjacent to the reflective layer, and a hydrophobic layer on the electrode layer. Alternatively, the reflective layer may act as the pixel electrode. Pixel walls, associated with and formed around each pixel, the hydrophobic layer, and the transparent top support plate at least partially enclose a fluid region that includes an electrolyte solution and the oil, which is immiscible with the electrolyte solution. An "opaque" fluid, as described herein, is used to describe a fluid that appears black or to have color to an observer. For example, an opaque fluid appears black to an observer when it strongly absorbs a broad spectrum of wavelengths (e.g., including those of red, green and blue light) in the visible region of light or electromagnetic radiation. In some embodiments, the opaque fluid is a non-polar electrowetting oil.

The opaque fluid is disposed in the fluid region. A coverage area of the opaque fluid on the bottom hydrophobic layer is electrically adjustable to affect the amount of light incident on the reflective electrowetting display that reaches the reflective material at the bottom of each pixel.

In addition to pixels, pixel spacers and edge seals may also be located between the two support plates. Pixel spacers and edge seals that mechanically connect the first support plate with and opposite to the second overlying support plate, or which form a separation between the first support plate and the second support plate, can contribute to the mechanical integrity of the electrowetting display. Edge seals, for example, being disposed along a periphery of an array of electrowetting pixels, may contribute to retaining fluids (e.g., the first and second fluids) between the first support plate and the second overlying support plate. Pixel spacers can be at least partially transparent so as to not hinder throughput of light in the electrowetting display. The transparency of pixel spacers may at least partially depend on the refractive index of the pixel spacer material, which can be similar to or the same as the refractive indices of surrounding media. Pixel spacers may also be chemically inert to surrounding media.

In some embodiments, a display device as described herein may comprise a portion of a system that includes one or more processors and one or more computer memories, which may reside on a control board, for example. Display software may be stored on the one or more memories and may be operable with the one or more processors to modulate light that is received from an outside source (e.g., ambient room light) or out-coupled from a light guide of the display device. For example, display software may include code executable by a processor to modulate optical properties of individual pixels of the electrowetting display based, at least in part, on electronic signals representative of image and/or video data. The code may cause the processor to modulate the optical properties of pixels by controlling electrical signals (e.g., voltages, currents, and fields) on, over, and/or in layers of the electrowetting display.

Figure 1B:
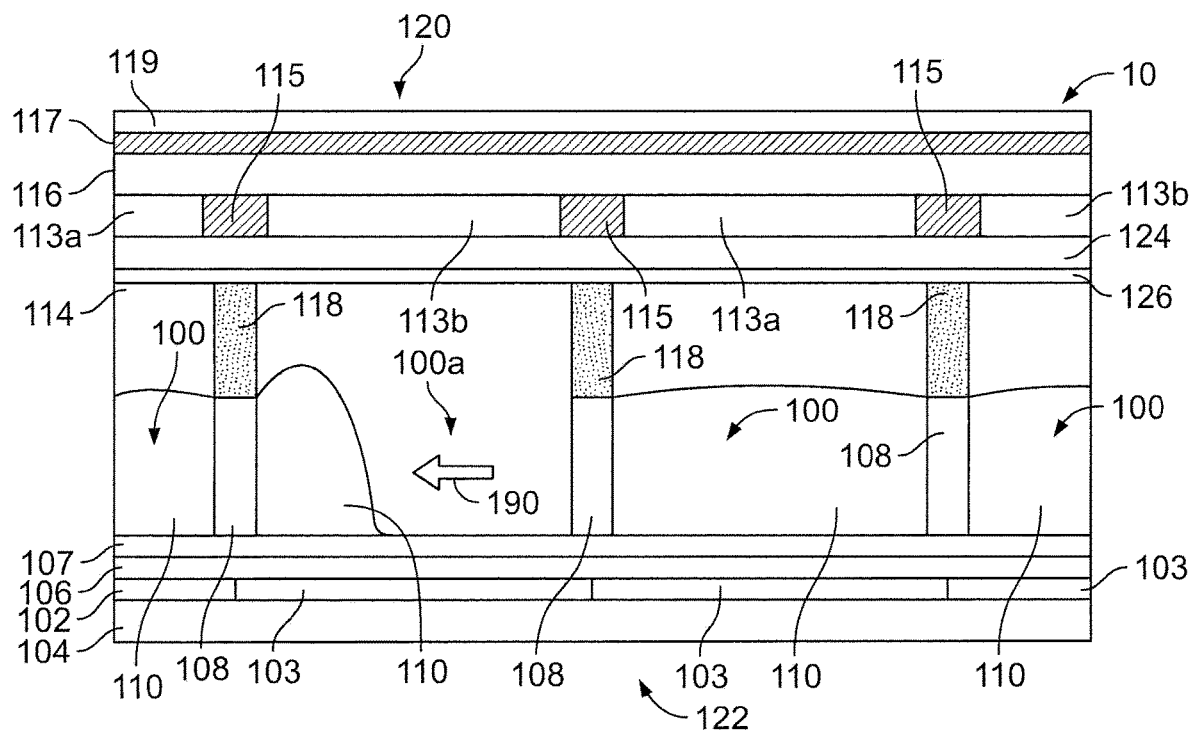
Figure 2:
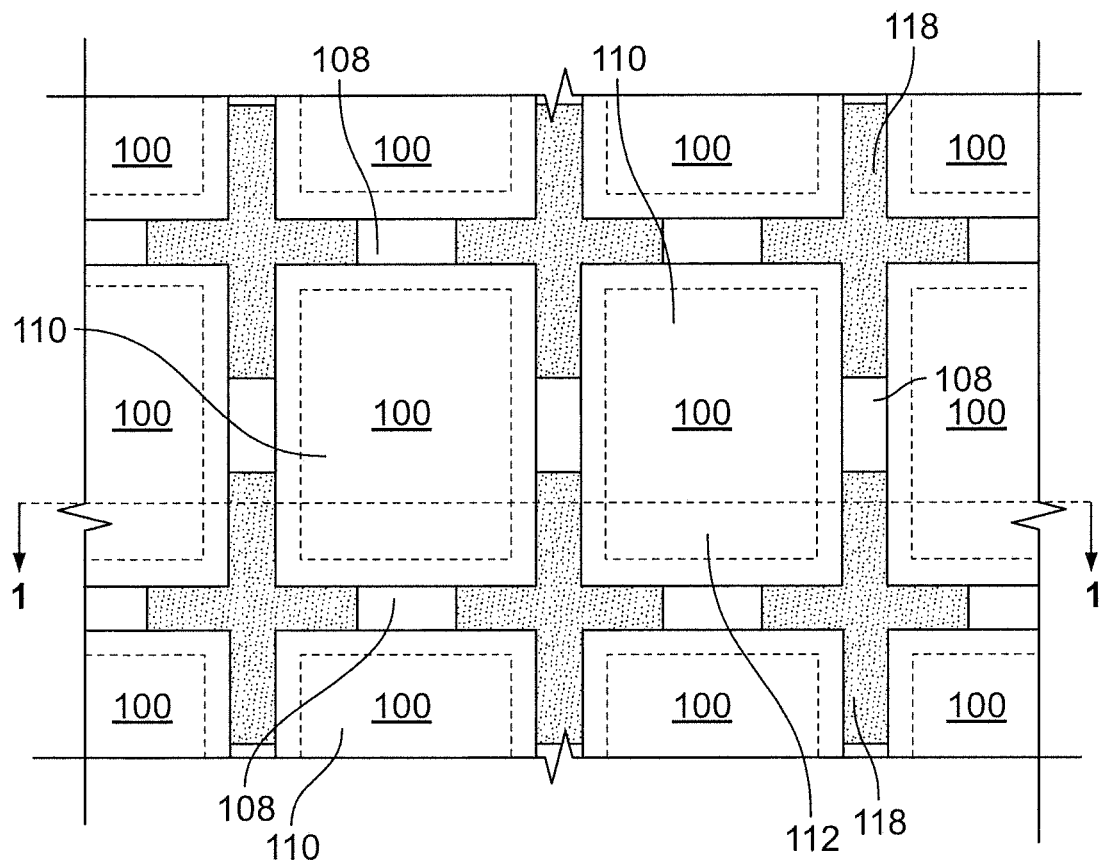
FIG. 2 illustrates a top view of the electrowetting pixels of FIG. 1A, according to various embodiments.

FIG. 1A is a cross-section of a portion of an example conventional reflective electrowetting display device 10 illustrating several electrowetting pixels 100 taken along sectional line 1-1 of FIG. 2. FIG. 1B shows the same cross-sectional view as FIG. 1A in which an electric potential has been applied to one of the electrowetting pixels 100 causing displacement of an oil disposed therein, as described below. FIG. 2 shows a top view of electrowetting pixels 100 formed over a bottom support plate 104 as well as pixel spacers 118. The view shown in FIG. 2 is simplified and does not depict each component illustrated in FIGS. 1A and 1B and primarily illustrates the row and column layout of pixels 100 with pixel spacers 118.

In FIGS. 1A and 1B, two complete electrowetting pixels 100 and two partial electrowetting pixels 100 are illustrated. Electrowetting display device 10 may include any number (usually a very large number, such as thousands or millions) of electrowetting pixels 100.

An electrode layer 102 is formed on a bottom support plate 104. In various embodiments, electrode layer 102 consists of individual pixel electrodes 103, each addressing an individual pixel 100. The individual pixel electrodes 103 may be connected to a transistor, such as a thin film transistor (TFT) (not shown), that is switched or otherwise controlled to either select or deselect an electrowetting pixel 100 using an active matrix addressing scheme, for example. A TFT is a particular type of field-effect transistor that includes thin films of an active semiconductor layer as well as a dielectric layer and metallic contacts over a supporting (but non-conducting) substrate, which may be glass or any of a number of other suitable transparent or non-transparent materials, for example. The TFTs and corresponding data lines may be formed within electrode layer 102 or within other layers over or within support plate 104.

In some embodiments, a dielectric barrier layer 106 may at least partially separate electrode layer 102 from a hydrophobic layer 107, also formed on bottom support plate 104. Barrier layer 106 may be formed from various materials including organic/inorganic multilayer stacks or layers. In some embodiments, hydrophobic layer 107 is an amorphous fluoropolymer layer including any suitable fluoropolymer(s), such as AF1600®, produced by DuPont, based in Wilmington, Del. Hydrophobic layer 107 may also include suitable materials that affect wettability of an adjacent material, for example.

Pixel walls 108 form a patterned electrowetting pixel grid on hydrophobic layer 107. Pixel walls 108 may comprise a photoresist material such as, for example, epoxy-based negative photoresist SU-8. The patterned electrowetting pixel grid comprises rows and columns that form an array of electrowetting pixels. For example, an electrowetting pixel may have a width and a length in a range of about 50 to 500 micrometers.

Oil 110 (or another opaque fluid), which may have a thickness (e.g., a height) in a range of about 1 to 10 micrometers, for example, overlays hydrophobic layer 107. Oil 110 is partitioned by pixel walls 108 of the patterned electrowetting pixel grid. A second fluid 114, such as an electrolyte solution, overlays oil 110 and pixel walls 108 of the patterned electrowetting pixel grid. Oil 110 is immiscible with second fluid 114.

Top support plate 116 is mounted over bottom support plate 104 to enclose a volume containing oil 110 and second fluid 114. Support plate 116 is generally transparent and may include a material such as glass, transparent thermoplastic, or the like. Color filters 113 are formed over a bottom surface (as illustrated in FIGS. 1A and 1B) of support plate 116.

Color filters 113a, 113b (collectively, 113) may be positioned over each of pixels 100. Each color filter 113 may be configured to be substantially transparent to particular ranges of wavelengths of light, while absorbing others. For example, color filter 113a may be transparent to red light having wavelengths ranging from 620 nm to 750 nm, while absorbing light having other wavelengths. Conversely, color filter 113b may be transparent to green light having wavelengths ranging from 495 nm to 570 nm, while absorbing light having other wavelengths. Various pixels 100 within device 10 may be associated with color filters 113 that are transparent to all wavelengths of visible light, namely visible white light. As used herein, visible light refers to wavelengths of electromagnetic radiation visible to the human eye. Generally, this includes electromagnetic radiation having wavelengths between about 400 nm to about 700 nm.

Color filters 113, therefore, may be utilized to assign each pixel 100 a color, so that when a particular pixel 100 is in an open or at least partially open state, light reflected by that pixel 100 will take on the color of the color filter 113 positioned over that pixel 100. In other embodiments of device 10, color filter 113 could instead be located over a bottom surface of each pixel (e.g., upon or incorporating into hydrophobic layer 107.

A number of black matrix members 115 are also formed over a surface of top support plate 116. Black matrix members 115 are generally positioned over each pixel wall 108 in device 10 when top support plate 116 is mounted over bottom support plate 104. Black matrix members 115 are configured to block or absorb all wavelengths of visible light and therefore reduce an amount of light that may enter device 10 over one pixel 100 while exiting device 10 over a different pixel 100.

As shown in FIGS. 1A and 1B, organic layer 124 is formed over the bottom surface of top support plate 116. Specifically, organic layer 124 is formed over the color filters 113 and black matrix members 115. Organic layer 124 may include an organic material, such as an organic polymer, an organic photo-sensitive polymer material, polyimide, acrylate or epoxy-based polymer material, such as an acrylate based overcoat material.

Electrode layer 126 is formed over organic layer 124. In embodiments, electrode layer 126 includes a conductive but generally transparent material such as indium tin oxide (ITO), conductive polymer, graphene or carbon nanotubes. Electrode layer 126 operates in conjunction with the individual pixel electrodes 103 of the bottom support plate 104 to subject the individual electrowetting pixels 100 to their respective driving voltages. In the depicted embodiment, electrode layer 126 forms a common continuous electrode positioned over all, or at least a majority, of electrowetting pixels 100 of electronic device 10. With electrode layer 126 set to a common voltage, the voltages of the individual pixel electrodes 103 can be separately adjusted to subject electrowetting pixels 100 to various driving voltages.

Pixel spacers 118 are attached to electrode layer 126. When top support plate 116 is mounted over bottom support plate 104, pixel spacers 118 rest upon a top surface of one or more pixel walls 108, as depicted in FIGS. 1A and 1B. Multiple pixel spacers 118 may be interspersed throughout the array of pixels 100. The dimensions and shape of pixel spacers 118 are not generally constrained—alternative shapes include crosses, lines of pixel spacers, or full grid pixel spacer structures.

As shown in FIGS. 1A and 1B, pixel spacers 118 are generally located over pixel walls 108 and therefore do not interfere substantially with light entering and being reflected out of electrowetting pixels 100. FIG. 2 shows a cross sectional view of electrowetting pixels 100 including pixel walls 108 and the pixel spacers 118 resting upon the pixel walls 108. As illustrated, pixel spacers 118 are shaped so that they are located over only pixels walls 108 and no portion (or at least a limited portion) of pixel spacers 118 occupies of is otherwise located over pixels 100. This shape of pixel spacers 118 reduces the likelihood that pixel spacers 118 will interfere with or potentially block light entering or being reflected out of pixels 100.

Returning to FIGS. 1A and 1B, in some embodiments of device 10, a front light component may be positioned over an edge of viewing side 120 of device 10. In these embodiments, a light guide 117 may be positioned over device 10 to guide light generated by the front light component over viewing side 120 of device 10. A layer 119, e.g. glass or other material, incorporating various touch-sensitive structures may also be positioned over device 10. A diffuser film (not shown) may be formed over or, in some cases, integrated into, a portion of, top support plate 116 to diffuse light striking a surface of top support plate 116 and passing therethrough.

Display device 10 has viewing side 120 on which an image formed by electrowetting display device 10 may be viewed, and an opposing rear side 122. Support plate 116 faces viewing side 120 and bottom support plate 104 faces rear side 122. Reflective electrowetting display device 10 may be a segmented display type in which the image is built of segments. The segments may be switched simultaneously or separately. Each segment includes one electrowetting pixel 100 or a number of electrowetting pixels 100 that may be adjacent or distant from one another. Electrowetting pixels 100 included in one segment are switched simultaneously, for example. Electrowetting display device 10 may also be an active matrix driven display type or a passive matrix driven display, for example.

As mentioned above, second fluid 114 is immiscible with oil 110. Second fluid 114 is electrically conductive and/or polar, and may be water or a salt solution such as a solution of potassium chloride in water, for example. In certain embodiments, second fluid 114 is transparent, but may be colored or light-absorbing. Oil 110 is electrically non-conductive and may for instance be an alkane like hexadecane or (silicone) oil.

Hydrophobic layer 107 is arranged on bottom support plate 104 to create an electrowetting surface area. The hydrophobic character of hydrophobic layer 107 causes oil 110 to adhere preferentially to hydrophobic layer 107 because oil 110 has a higher wettability with respect to the surface of hydrophobic layer 107 than second fluid 114 in the absence of a driving voltage. Wettability relates to the relative affinity of a fluid for the surface of a solid. Wettability increases with increasing affinity, and it may be measured by the contact angle formed between the fluid and the solid and measured internal to the fluid of interest. For example, such a contact angle may increase from relative non-wettability of more than 90° to complete wettability at 0°, in which case the fluid tends to form a film on the surface of the solid.

In some embodiments, oil 110 absorbs light within at least a portion of the optical spectrum and so may form a color filter. The fluid may be colored by addition of pigment particles or dye, for example. Alternatively, oil 110 may be black (e.g., absorbing substantially all light within the optical spectrum) or reflecting. Hydrophobic layer 107 may be transparent or reflective. A reflective layer may reflect light within the entire visible spectrum, making the layer appear bright, or reflect a portion of light within the visible spectrum, making the layer have a color.

If a driving voltage is applied across an electrowetting pixel 100, electrowetting pixel 100 will enter into an active or at least partially open state. Electrostatic forces will move second fluid 114 toward electrode layer 102 within the active pixel, thereby displacing oil 110 from that area of hydrophobic layer 107 to pixel walls 108 surrounding the area of hydrophobic layer 107, to a droplet-like form. Such displacing action at least partly uncovers oil 110 from the surface of hydrophobic layer 107 of electrowetting pixel 100. Due to the configuration of electrode layer 102, when the voltage is applied across the electrowetting pixel 100, oil 110 generally always move in the same direction within the pixel 100 so as to form into a droplet against the same wall 108 of the pixel 100.

FIG. 1B shows one of electrowetting pixels 100 in an active state (see pixel 100a). With a driving voltage applied to a pixel electrode in electrode layer 102 underneath the activated electrowetting pixel 100a, second fluid 114 is attracted towards pixel electrode in electrode layer 102 displacing oil 110 within the activated electrowetting pixel 100.

As second fluid 114 moves towards hydrophobic layer 107 of the activated electrowetting pixel 100, oil 110 is displaced in a predictable direction within pixel 100a towards one of pixel walls 108 (e.g., in the direction of arrow 190), referred to herein as the oil displacement direction, and moves towards a pixel wall 108 of the activated pixel 100 or is otherwise displaced. The predictable direction 190 of oil 110 movement may result from the floor of pixel 100a (e.g., the top surface of hydrophobic layer 107 being at least partially raised at the far right of pixel 100a (as viewed in 1B). This may promote second fluid 114 entering pixel 100a at the right side of pixel 100a and promoting movement of oil 110 in direction 190.

In the example of FIG. 1B, pixel 100a is fully open at a maximum driving voltage and oil 110 of pixel 100a has formed a droplet over an oil accumulation area of pixel 100a as a result of the driving voltage being applied to pixel 100a. After activation of pixel 100a, when the voltage across electrowetting pixel 100a is returned to an inactive signal level of zero or a value near to zero, electrowetting pixel 100a will return to an inactive or closed state, where oil 110 flows back to cover hydrophobic layer 107. In this way, oil 110 forms an electrically controllable optical switch in each electrowetting pixel 100.

With oil 110 of pixel 100a displaced following the application of a driving voltage to pixel 100a, light can enter pixel 100a through color filter 113b, strike the exposed portion of the reflective surface at the bottom of pixel 100a, and reflect back out through color filter 113b.

Figure 3:
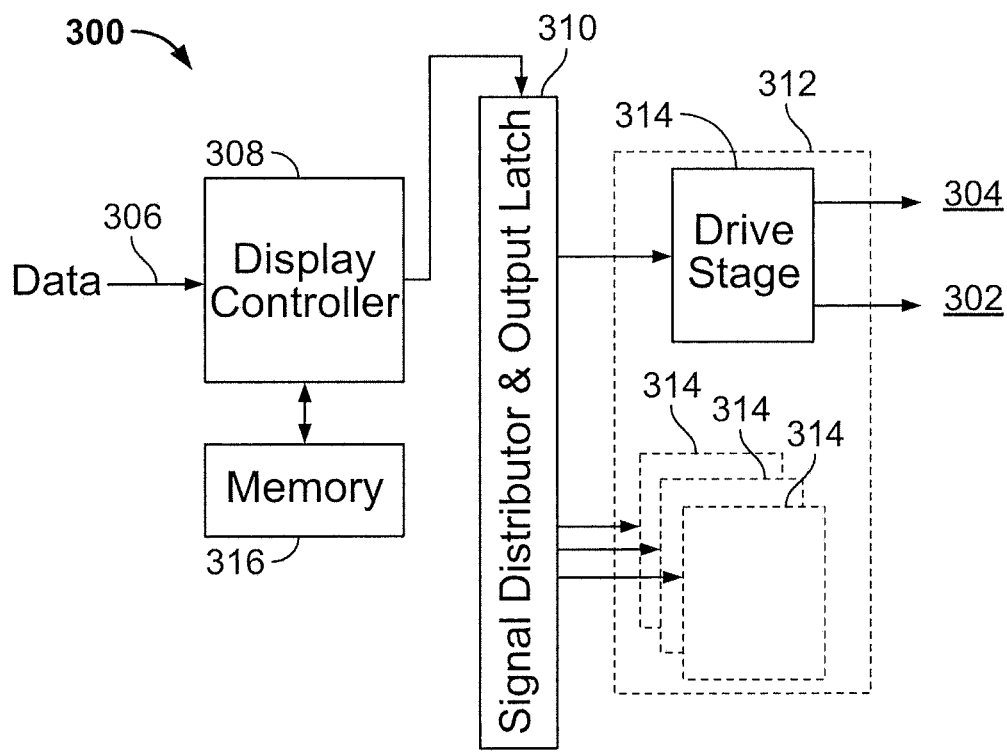
FIG. 3 is a block diagram of an example embodiment of an electrowetting display driving system, including a control system of the electrowetting display device.

FIG. 3 shows a block diagram of an example embodiment of an electrowetting display driving system 300, including a control system of the display device. Display driving system 300 can be of the so-called direct drive type and may be in the form of an integrated circuit adhered or otherwise connected to bottom support plate 104. Display driving system 300 includes control logic and switching logic, and is connected to the display by means of electrode signal lines 302 and a common signal line 304. Each electrode signal line 302 connects an output from display driving system 300 to a different electrode within each pixel 100, respectively. Common signal line 304 is connected to second fluid 114 through a common electrode. Also included are one or more input data lines 306, whereby display driving system 300 can be instructed with data so as to determine which pixels 100 should be in an active or open state and which pixels 100 should be in an inactive or closed state at any moment of time. In this manner, display driving system 300 can determine a target reflectance value for each pixel 100 within the display.

Electrowetting display driving system 300 as shown in FIG. 3 includes a display controller 308, e.g., a microcontroller, receiving input data from input data lines 306 relating to the image to be displayed. Display controller 308, being in this embodiment the control system, is configured to apply a voltage to the first electrode to establish a particular display state (i.e., reflectance value) for a pixel 100. The microcontroller controls a timing and/or a signal level of at least one pixel 100.

The output of display controller 308 is connected to the data input of a signal distributor and data output latch 310. Signal distributor and data output latch 310 distributes incoming data over a plurality of outputs connected to the display device, via drivers in certain embodiments. Signal distributor and data output latch 310 cause data input indicating that a certain pixel 100 is to be set in a specific display state to be sent to the output connected to pixel 100. Signal distributor and data output latch 310 may be a shift register. The input data is clocked into the shift register and at receipt of a latch pulse the content of the shift register is copied to signal distributor and data output latch 310. Signal distributor and data output latch 310 has one or more outputs, connected to a driver assembly 312. The outputs of signal distributor and data output latch 310 are connected to the inputs of one or more driver stages 314 within electrowetting display driving system 300. The outputs of each driver stage 314 are connected through electrode signal lines 302 and common signal line 304 to a corresponding pixel 100. In response to the input data, a driver stage 314 will output a voltage of the signal level set by display controller 308 to set one of pixels 100 to a corresponding display state having a target reflectance level.

To assist in setting a particular pixel to a target reflectance level, memory 316 may also store data that maps a particular driving voltage for a pixel to a corresponding reflectance value and vice versa. The data may be stored as one or more curves depicting the relationship between driving voltage and reflectance value, or a number of discrete data points that map a driving voltage to a reflectance value and vice versa. As such, when display controller 308 identifies a target reflectance value for a particular pixel, display controller 308 can use the data mapping driving voltage to reflectance value to identify a corresponding driving voltage. The pixel can then be driven with that driving voltage.

As described above, in conventional electronic devices the pixel spacers separating the device's top and bottom support plates are directly mounted to the electrode layer of the top support plate. FIG. 4A, for example, shows a bottom view of top support plate 116 including electrode layer 126 and a number of pixel spacers 118 mounted directly to electrode layer 126. FIG. 4B depicts a cross sectional view of a portion of the top support plate taken along sectional line 4B-4B of FIG. 4A. The view depicted in FIG. 4B therefore shows support plate 116 and the various layers and components over support plate 116 in a configuration that is upside-down from that shown in FIGS. 1A and 1B.

As shown in FIG. 4B, black matrix members 115 is formed over top support plate 116. Organic layer 124 is over black matrix members 115 and electrode layer 126 is over organic layer 124. Pixel spacer 118 is attached to electrode layer 126.

During the formation of pixel spacer 118, the pixel spacer 118 material (e.g., a photoresist material) is deposited over electrode layer 126 in the shape of pixel spacer 118. That material is then cured, making the material relatively strong and resilient. During curing, however, the material making up pixel spacer 118 exhibits shrinkage as compared to the electrode layer 126, which can result in a shear force developing between electrode layer 126 and pixel spacer 118.

Due to the shape of pixel spacer 118 (which is generally constrained so that pixel spacer 118 can be positioned over pixel walls 108 without a portion of pixel spacer 118 being located over a pixel 100), the pixel spacer has a number of extended portions 118' that are relatively narrow. As depicted in FIG. 4A, portions 118' extend away from a central region of pixel spacer 118. Portions 118' of pixel spacer 118 may have a thickness or width that is less than that of pixel walls 108. Furthermore, the length of portions 118' is greater than their width, as portions 118' extend along at least a portion of pixel walls 108. In various embodiments, the ratio of the width of portions 118' to their length may be approximately 8:40.

In various electronic devices, pixel spacers 118 can have any suitable shape for resting upon the pixel walls of the electronic device. As such, pixel spacers 118 may include any number of extensions or legs suited for mounting pixel spacers 118 over the pixel walls of a display. For example, a pixel spacer 118 may have one or more portions that extend away from a central region of the pixel spacer 118, where each portion may be configured to rest upon a pixel wall. The portions of pixel spacer 118 may all have the same general geometry or, in some cases, the portions may not have the same shape so that a pixel spacer 118 may not be symmetrical. In fact pixel spacer 118 may have any shape configured to rest upon or contact at least a portion of a pixel wall to provide support to a top support plate positioned over a bottom support plate.

As pixel spacer 118 is cured, pixel spacer 118 (and, particularly, portions 118' of pixel spacers 118) shrink creating shear force, which can, ultimately, crack electrode layer 126. The greatest shear forces may be created at the tips of portions 118', due to the shrinkage occurring along the length of portions 118'.

Figure 4C:
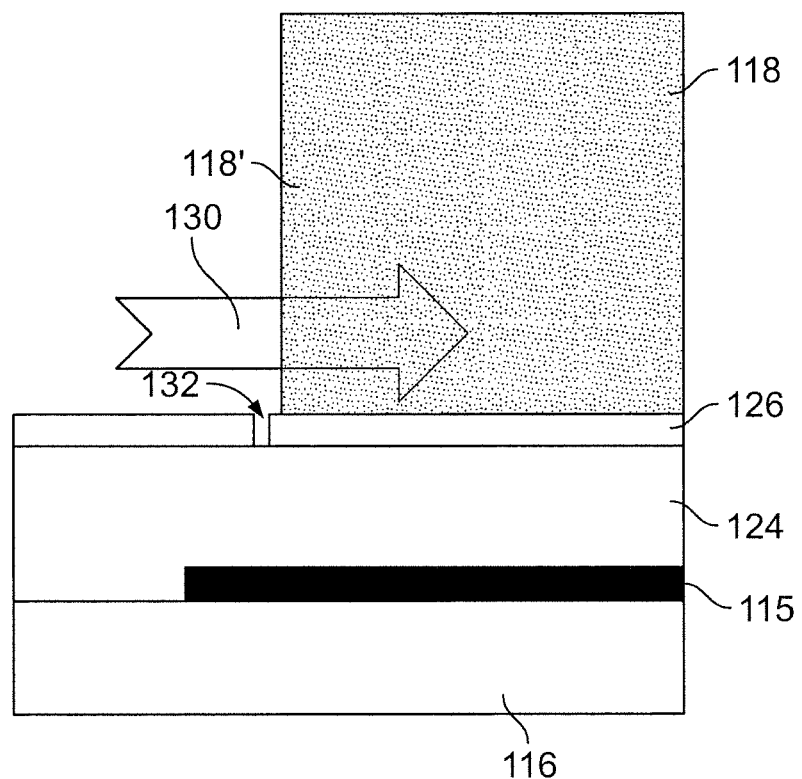
FIG. 4C shows an enlarged view of a pixel spacer from FIG. 4B.

To illustrate this phenomenon, FIG. 4C shows a zoomed-in view of a pixel spacer 118. The view shown in FIG. 4C includes the portion of FIG. 4B delineated by dashed box 128. During curing, portion 118' of pixel spacer 118 exhibits shrinkage in the direction of arrow 130 along the length of portion 118'. This shrinkage creates the strong shear force between the tip of portion 118' and the stacked layers lying beneath including, particularly, electrode layer 126. The shear force may be concentrated around the end of portion 118' due to the irregularity of the shape of pixel spacer 118. If the adhesion between electrode layer 126 and portion 118' is sufficiently strong and because electrode layer 126 consists of micro-grains, the shear force can break electrode layer 126 resulting in formation of crack 132.

Figure 5B:
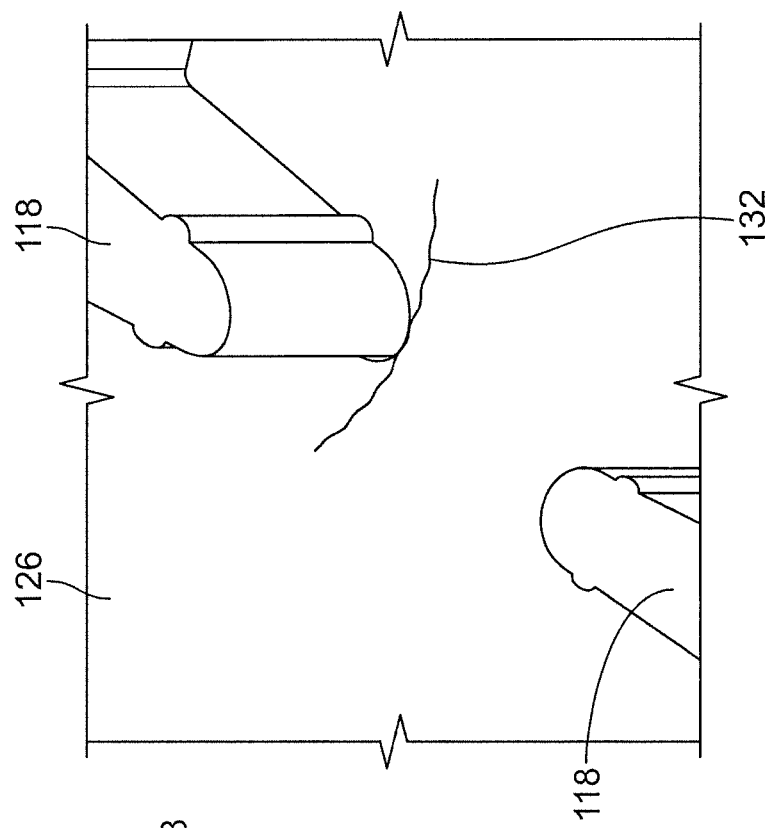
FIGS. 5A and 5B are illustrations depicting perspective views of a bottom surface of a support plate in which pixel spacers have been formed over an electrode layer.
Figure 5A:
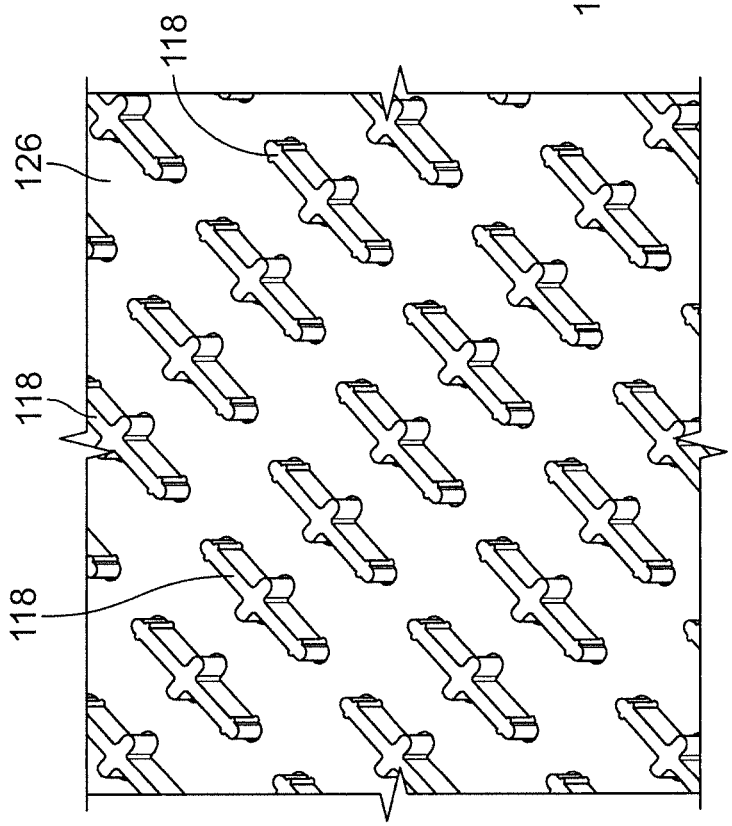

FIGS. 5A and 5B are illustrations depicting perspective views of a bottom surface of a support plate in which pixel spacers 118 have been formed over electrode layer 126. Following curing of pixel spacers 118, a portion of a pixel spacer 118 has shrunk resulted in formation of crack 132, as shown in the zoomed-in photograph of FIG. 5B.

To reduce the likelihood of cracking electrode layer 126, the present system provides an electrode layer that includes a number of openings. The openings are generally windows or gaps in the electrode layer that are formed through the electrode layer to expose the material beneath the electrode layer. The openings in the electrode layer enable the pixel spacers, or at least a portion of the pixel spacers, to be directly attached to the organic layer under the electrode layer. The organic layer is more robust than the electrode layer and so the shear forces generated when the pixel spacers are cured may not result in similar crack or distortion of the electrode layer. The increased robustness of the organic layer as compared to the electrode layer may result from a difference in the coefficient of thermal expansion (CTE) between the organic layer and the electrode layer, i.e. >70 ppm/K and <10 ppm/K, respectively.

Figure 6B:
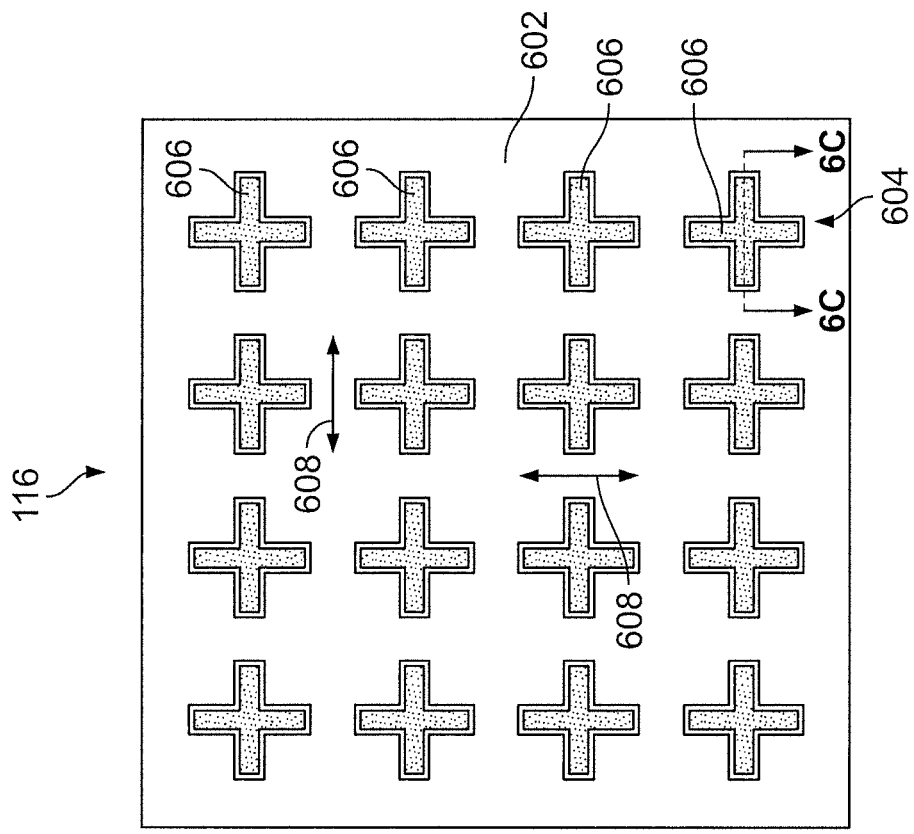
FIG. 6B shows a bottom view of a top support plate including an electrode layer that includes a number of openings and pixels spacers formed over the top support plate.
Figure 6A:
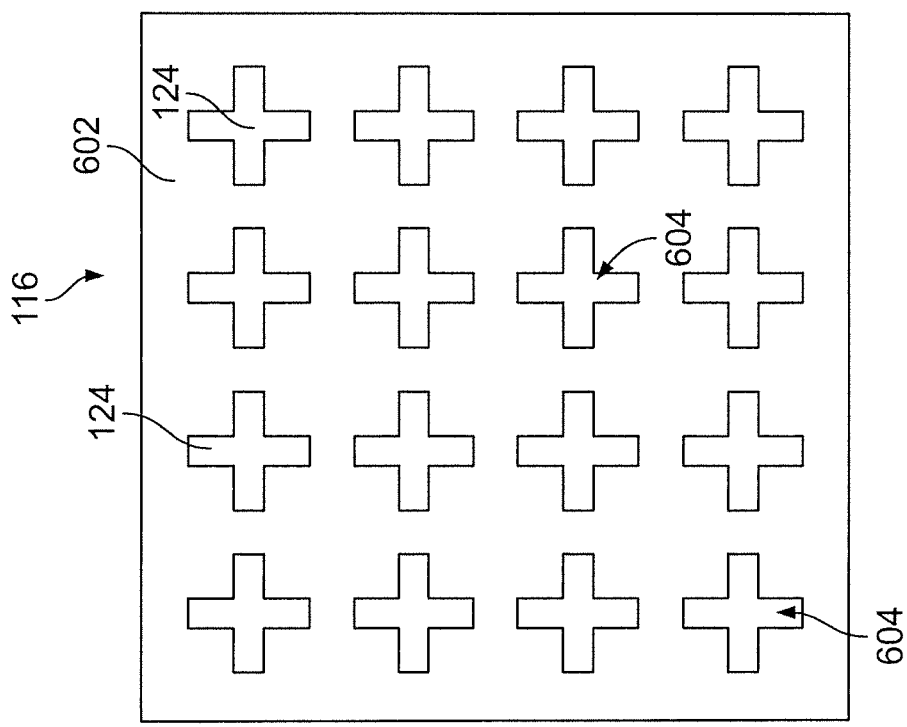
FIG. 6A shows a bottom view of a top support plate including an electrode layer that includes a number of openings.

FIG. 6A shows a bottom view of top support plate 116 including an electrode layer 602 formed over organic layer 124, which is, in turn, formed over top support plate 116. Electrode layer 602 includes a conductive material, such as ITO, which is suitable for formation over organic layer 124.

As illustrated, electrode layer 602 is patterned to include a number of openings 604. Openings 604 are formed through electrode layer 602 and expose the organic layer 124 laying behind electrode layer 602. Openings 604 may be formed using any suitable process. For example, during fabrication of an electronic device, electrode layer 602 is formed and patterned over organic layer 124. The patterning of electrode layer 602 may involve the deposition and curing of photoresist materials formed over electrode layer 602, followed by the etching and removal of portions of electrode layer 602 to form openings 604 depicted in FIG. 6A.

Figure 6C:
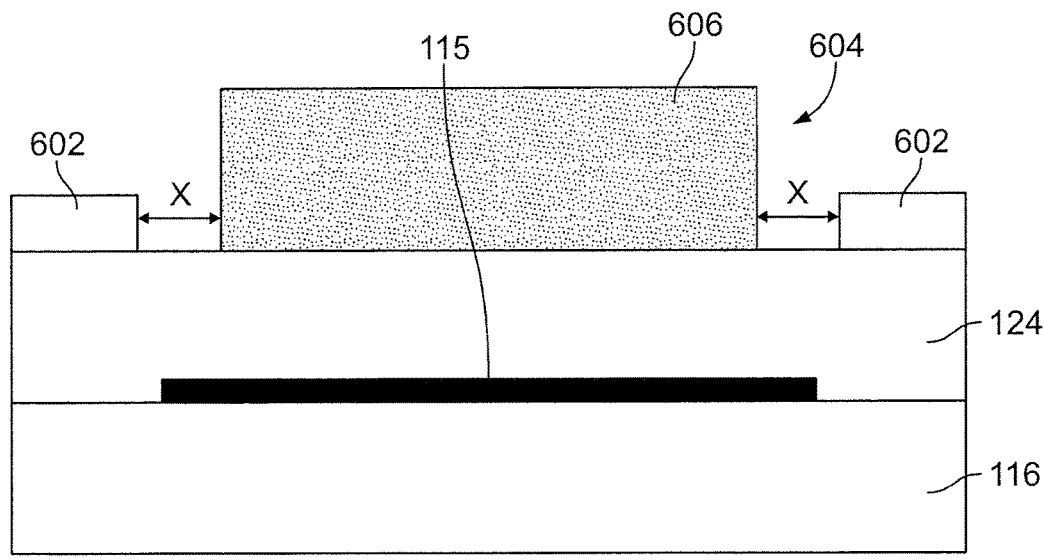
FIG. 6C shows a cross sectional view of a portion of the top support plate taken along sectional line 6C-6C of FIG. 6B.

After the formation of electrode layer 602, FIGS. 6B and 6C illustrate the formation of pixel spacers 606 over and through openings 604 of electrode layer 602. FIG. 6C shows a cross sectional view of a portion of the top support plate taken along sectional line 6C-6C of FIG. 6B. As illustrated, pixel spacers 606 are formed through openings 604 and are therefore in direct contact with organic layer 124, which is located behind electrode layer 602. As discussed above, by adhering pixel spacers 606 directly to organic layer 124 rather than electrode layer 602, the risk of crack formation in electrode layer 602 can be reduced, particularly during curing and shrinkage of pixel spacers 606. In this arrangement, pixels spacers 606 are connected to top support plate 116 through opening 604 of electrode layer 602.

Pixel spacers 606 may be formed using any suitable method, including the deposition of a photoresist material over openings 604. That photoresist material can then be cured form pixel spacers 606.

In some embodiments, in order to provide sufficient margin for error during fabrication, openings 604 may be made larger than pixel spacers 606. For example, openings 604 may be sized so that when pixel spacer 606 is placed into the center of opening 604, the minimum distance between a surface of the pixel spacer 606 and the electrode layer 602 is at least three microns. For example, with reference to FIG. 6C, opening 604 may be sized so that the distance x is not less than three microns when pixel spacer 606 is centrally located within opening 604 (the boundary around pixel spacer 606 is further illustrated in the view shown in FIG. 6B).

Even when electrode layer 602 includes a number of openings 604, electrode layer 602 can still operate as a common electrode to the top support plate 116 over each pixel in an electronic device. Although openings 604 are formed in electrode layer 602, openings 604 do not isolate different regions of electrode layer 602 from one another. Instead, openings 604 still leave relatively large portions of electrode layer 602 overlaying each pixel 100 that are interconnected to one another—see arrows 608 in FIG. 6B. As such, electrode layer 602 still forms a continues layer of conductive material over top support plate 116 so that a common voltage can be maintained over each pixel of the device.

Figure 7:
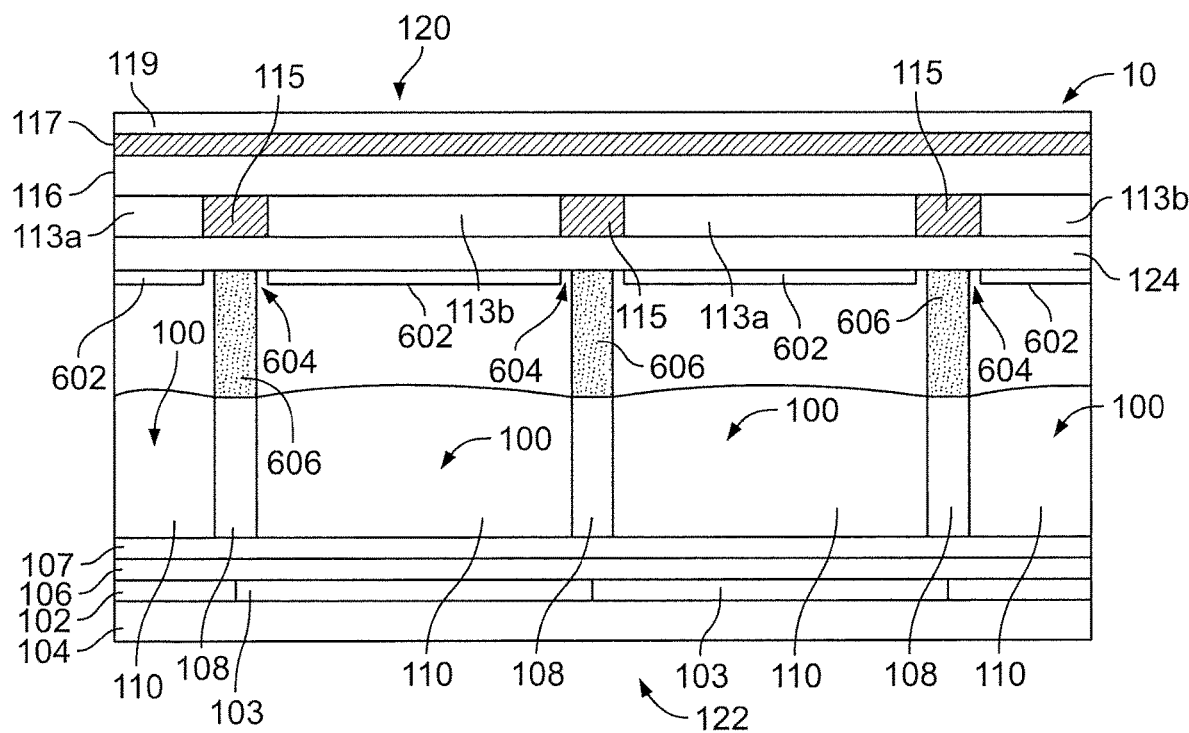
FIG. 7 illustrates a cross-sectional view of an electronic device incorporating a top support plate that includes an electrode layer having openings through which pixel spacers are formed.

FIG. 7 illustrates a cross-sectional view of an electronic device incorporating top support plate 116 that includes electrode layer 602 having openings 604 through which pixel spacers 606 are formed. As depicted, top support plate 116 is mounted over bottom support plate 104. Note that this involves inverting top support plate 116 from the upside-down orientation depicted in FIG. 6C.

Top support plate 116 includes color filters 113 and black matrix members 115. Organic layer 124 is formed over color filters 113 and black matrix members 115. Electrode layer 602 is formed over organic layer 124. As illustrated, electrode layer 602 includes a number of openings 604 that expose organic layer 124 located behind electrode layer 602.

Pixel spacers 606 are attached to organic layer 124 through openings 604 over black matrix members 115. In this configuration, pixel spacers 606 are in direct contact with organic layer 124 and do not contact electrode layer 602. As discussed above, this configuration may be more robust than one in which pixel spacers 606 are mounted directly to electrode layer 602. Organic layer 124 is generally more robust than electrode layer 602 and is less likely to crack or otherwise distort during the curing process for pixel spacers 606. With top support plate 116 mounted over bottom support plate 104, pixel spacers 606 result upon pixel walls 108 as illustrated.

In embodiments of device 10, electrode layer 602 may have a thickness of approximately 0.15 microns or less than 0.20 microns, while pixel spacers 606 have a thickness or height of approximately 20 microns or at least 15 microns. As such, the ratio of the height of pixel spacer 606 to a thickness of the electrode layer 602 may be at least 75. Given that electrode layer 602 is substantially thinner than pixel spacers 606, the mounting of pixel spacers 606 to organic layer 124 rather than electrode layer 602 does not significant affect the height of pixel spacers 606 with respect to support plate 116. As such, the pixel spacer 606 configuration shown in FIG. 7 does not significantly modify the distance between top support plate 116 versus bottom support plate 104 as compared to conventional electronic devices. Even so, if desired, when attaching pixel spacers 606 to organic layer 124 rather than electrode layer 602, the height of pixel spacers 606 may be increased by an amount equal to the thickness of electrode layer 602 to compensate the reduced stand-off distance of top support plate 116.

As discussed above, the shear forces between the electrode layer and pixel spacers created by shrinkage of the pixel spacers may be greatest along the lengths of the extension legs of the pixel spacers and at a maximum at the tip of the extension legs. Accordingly, in an alternative embodiment, rather than form openings in the electrode layer that are sufficiently large to attach the entire pixel spacer directly to the organic layer, the openings can be restricted to only being formed under those portions of the pixel spacers that exhibit the majority of the shear forces. For example, the openings may be formed only under the distal portions of the extension leg portions of the pixel spacers, such as under the tips or ends of the extension leg portions.

Figure 8B:
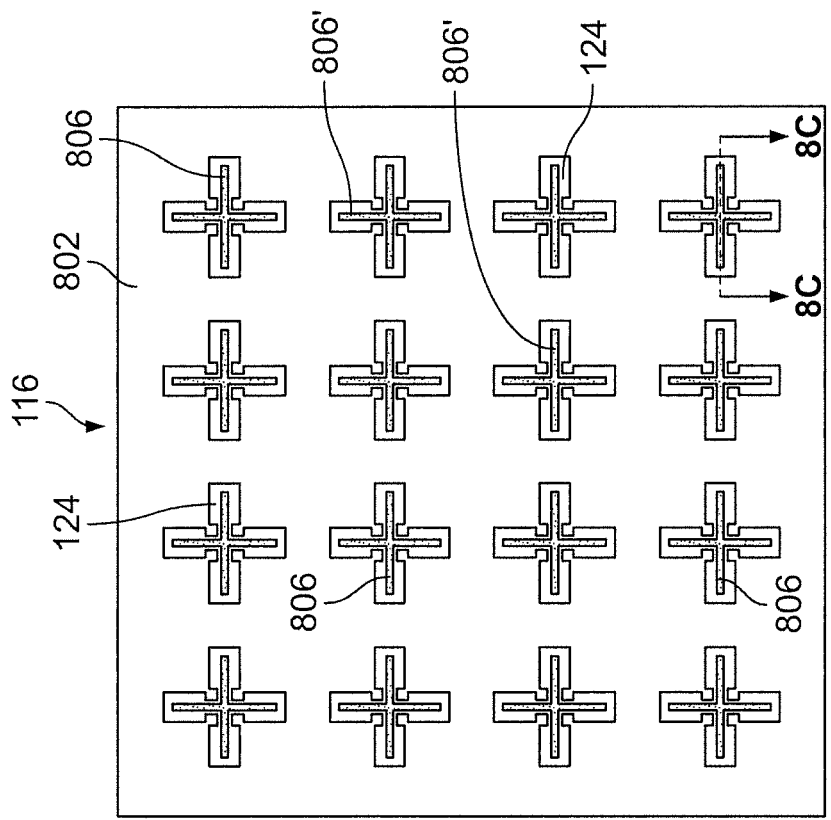
FIGS. 8B and 8C illustrate the formation of pixel spacers over the openings of the electrode layer of FIG. 8A.
Figure 8A:
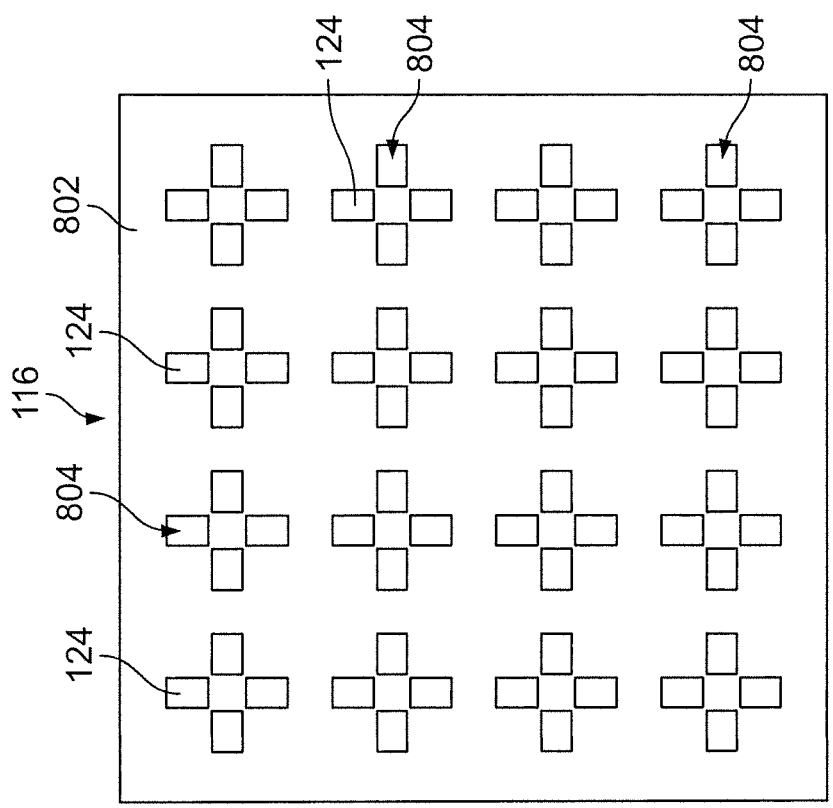
FIG. 8A shows a bottom view of a second embodiment of a top support plate including an electrode layer.

To illustrate, FIG. 8A shows a bottom view of top support plate 116 including an electrode layer 802. Electrode layer 802 includes a conductive material, such as ITO, which is suitable for formation over organic layer 124. As illustrated, electrode layer 802 is patterned to include a number of openings 804. Openings 804 are formed through electrode layer 802 and expose the organic layer 124 laying behind electrode layer 802. Openings 804 may be formed using any suitable process. For example, during fabrication of an electronic device, electrode layer 802 is formed and patterned over organic layer 124. The patterning of electrode layer 802 may involve the deposition and curing of photoresist materials formed over electrode layer 802, followed by the etching and removal of portions of electrode layer 802 to form openings 804 depicted in FIG. 8A.

Figure 8C:
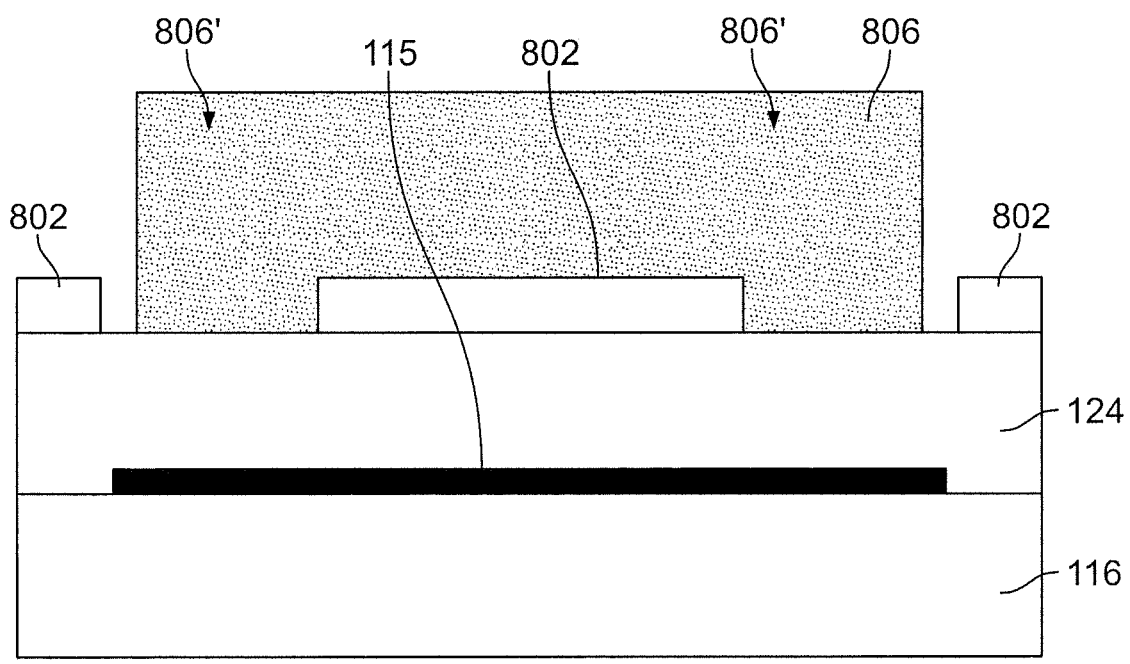

After the formation of electrode layer 802, FIGS. 8B and 8C illustrate the formation of pixel spacers 806 over openings 804 of electrode layer 802. FIG. 8C shows a cross sectional view of a portion of the top support plate 116 taken along sectional line 8C-8C of FIG. 8B. As illustrated, pixel spacers 806 are formed through and over openings 804. In this configuration, the extended portions 806' of pixel spacers 806 are in direct contact with and adhere to organic layer 124 through different openings 804 in electrode layer 802, which is located behind electrode layer 802. As discussed above, by adhering portions 806' of pixel spacers 806 directly to organic layer 124 rather than electrode layer 802, the risk of crack formation in electrode layer 802 can be reduced, particularly during curing and shrinkage of pixel spacers 806. The central regions of pixel spacers 806 between portions 806' do not exhibit as much shrinkage as portions 806'. Consequently, the central regions of pixel spacers 806 may be mounted directly to electrode layer 802 with reduced risk of excessive shear forces being created and consequent cracking of electrode layer 802.

Pixel spacers 806 may be formed using any suitable method, including the deposition of a photoresist material over openings 804. That photoresist material can then be cured form pixel spacers 806.

In some embodiments, in order to provide sufficient margin for error, openings 804 may be made larger than portions 806' of pixel spacers 806.

Even when electrode layer 802 includes a number of openings 804, electrode layer 802 can still serve the purpose of being a common electrode to the top support plate 116 over each pixel in an electronic device. Although openings 804 are formed in electrode layer 802, openings 804 do not isolate different regions of electrode layer 802 from one another. Instead, openings 804 still leave relatively large portions of electrode layer 802 overlaying each pixel 100 that are interconnected to one another.

Figure 9:
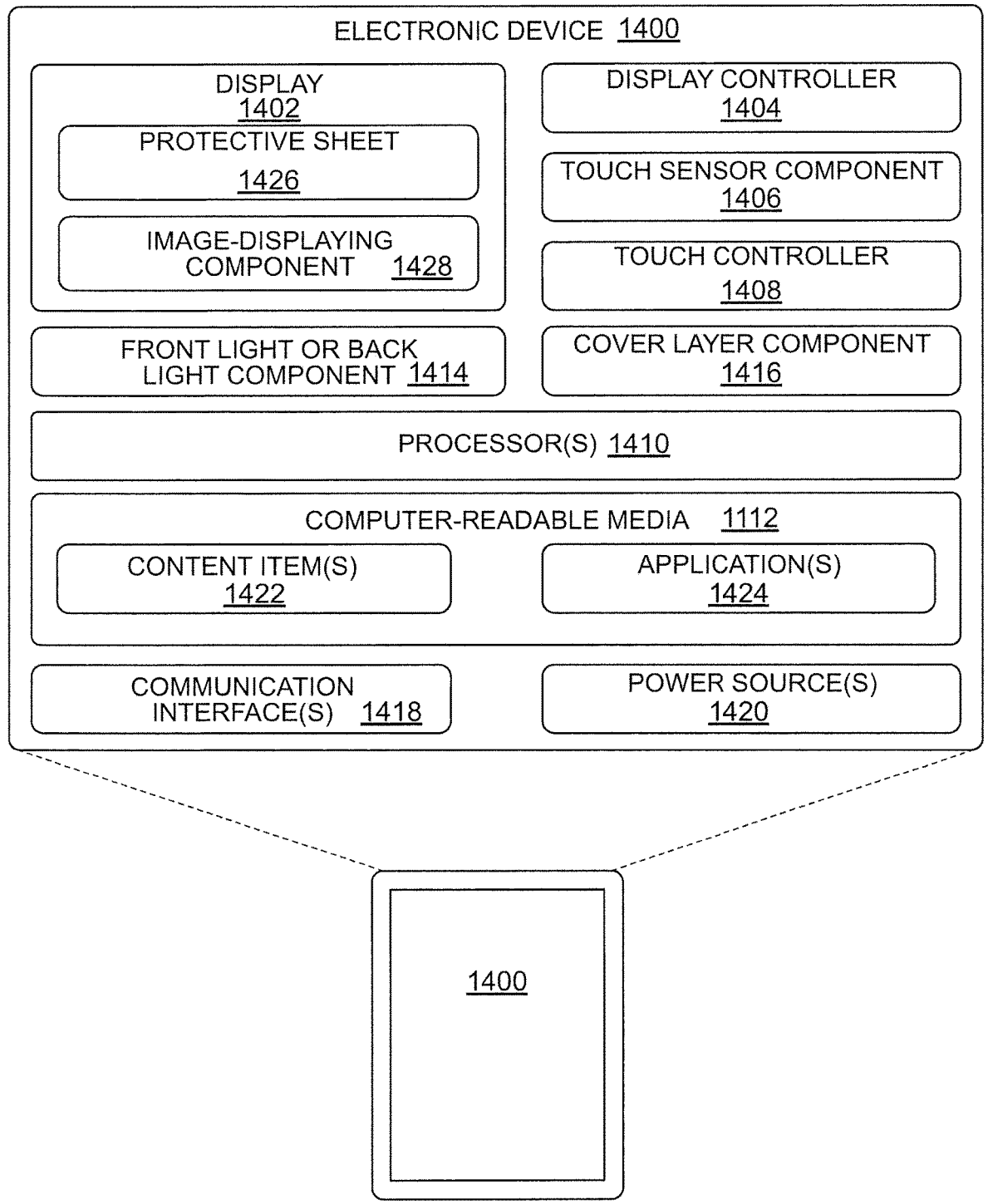
FIG. 9 illustrates an example electronic device that may incorporate a display device, according to various embodiments.

FIG. 9 illustrates an example electronic device 1400 that may incorporate any of the display devices discussed above. Electronic device 1400 may comprise any type of electronic device having a display. For instance, electronic device 1400 may be a mobile electronic device (e.g., an electronic book reader, a tablet computing device, a laptop computer, a smart phone or other multifunction communication device, a portable digital assistant, a wearable computing device, or an automotive display). Alternatively, electronic device 1400 may be a non-mobile electronic device (e.g., a computer display or a television). In addition, while FIG. 9 illustrates several example components of electronic device 1400, it is to be appreciated that electronic device 1400 may also include other conventional components, such as an operating system, system busses, input/output components, and the like. Further, in other embodiments, such as in the case of a television or computer monitor, electronic device 1400 may only include a subset of the components illustrated.

Regardless of the specific implementation of electronic device 1400, electronic device 1400 includes a display 1402 and a corresponding display controller 1404. The display 1402 may represent a reflective or transmissive display in some instances or, alternatively, a transflective display (partially transmissive and partially reflective).

In one embodiment, display 1402 comprises an electrowetting display that employs an applied voltage to change the surface tension of a fluid in relation to a surface. For example, such an electrowetting display may include an array of pixels as described herein, though claimed subject matter is not limited in this respect. By applying a voltage across a portion of an electrowetting pixel of an electrowetting display, wetting properties of a surface may be modified so that the surface becomes increasingly hydrophilic. As one example of an electrowetting display, the modification of the surface tension acts as an optical switch by displacing a colored oil film if a voltage is applied to individual pixels of the display. If the voltage is absent, the colored oil forms a continuous film within a pixel, and the color may thus be visible to a user. On the other hand, if the voltage is applied to the pixel, the colored oil is displaced and the pixel becomes transparent. If multiple pixels of the display are independently activated, display 1402 may present a color or grayscale image. The pixels may form the basis for a transmissive, reflective, or transmissive/reflective (transreflective) display. Further, the pixels may be responsive to high switching speeds (e.g., on the order of several milliseconds), while employing small pixel dimensions. Accordingly, the electrowetting displays herein may be suitable for applications such as displaying video or other animated content.

Of course, while several different examples have been given, it is to be appreciated that while some of the examples described above are discussed as rendering black, white, and varying shades of gray, it is to be appreciated that the described techniques apply equally to reflective displays capable of rendering color pixels. As such, the terms "white," "gray," and "black" may refer to varying degrees of color in implementations utilizing color displays. For instance, where a pixel includes a red color filter, a "gray" value of the pixel may correspond to a shade of pink while a "white" value of the pixel may correspond to a brightest red of the color filter. Furthermore, while some examples herein are described in the environment of a reflective display, in other examples, display 1402 may represent a backlit display, examples of which are mentioned above.

In addition to including display 1402, FIG. 9 illustrates that some examples of electronic device 1400 may include a touch sensor component 1406 and a touch controller 1408. In some instances, at least one touch sensor component 1406 resides with, or is stacked on, display 1402 to form a touch-sensitive display. Thus, display 1402 may be capable of both accepting user touch input and rendering content in response to or corresponding to the touch input. As several examples, touch sensor component 1406 may comprise a capacitive touch sensor, a force sensitive resistance (FSR), an interpolating force sensitive resistance (IFSR) sensor, or any other type of touch sensor. In some instances, touch sensor component 1406 is capable of detecting touches as well as determining an amount of pressure or force of these touches.

FIG. 9 further illustrates that electronic device 1400 may include one or more processors 1410 and one or more computer-readable media 1412, as well as a front light component 1414 (which may alternatively be a backlight component in the case of a backlit display) for lighting display 1402, a cover layer component 1416, such as a cover glass or cover sheet, one or more communication interfaces 1418 and one or more power sources 1420. The communication interfaces 1418 may support both wired and wireless connection to various networks, such as cellular networks, radio, WiFi networks, short range networks (e.g., Bluetooth® technology), and infrared (IR) networks, for example.

Depending on the configuration of electronic device 1400, computer-readable media 1412 (and other computer-readable media described throughout) is an example of computer storage media and may include volatile and nonvolatile memory. Thus, computer-readable media 1412 may include, without limitation, RAM, ROM, EEPROM, flash memory, and/or other memory technology, and/or any other suitable medium that may be used to store computer-readable instructions, programs, applications, media items, and/or data which may be accessed by electronic device 1400.

Computer-readable media 1412 may be used to store any number of functional components that are executable on processor 1410, as well as content items 1422 and applications 1424. Thus, computer-readable media 1412 may include an operating system and a storage database to store one or more content items 1422, such as eBooks, audio books, songs, videos, still images, and the like. Computer-readable media 1412 of electronic device 1400 may also store one or more content presentation applications to render content items on electronic device 1400. These content presentation applications may be implemented as various applications 1424 depending upon content items 1422. For instance, the content presentation application may be an electronic book reader application for rending textual electronic books, an audio player for playing audio books or songs, or a video player for playing video.

In some instances, electronic device 1400 may couple to a cover (not illustrated in FIG. 9) to protect the display 1402 (and other components in the display stack or display assembly) of electronic device 1400. In one example, the cover may include a back flap that covers a back portion of electronic device 1400 and a front flap that covers display 1402 and the other components in the stack. Electronic device 1400 and/or the cover may include a sensor (e.g., a Hall effect sensor) to detect whether the cover is open (i.e., if the front flap is not atop display 1402 and other components). The sensor may send a signal to front light component 1414 if the cover is open and, in response, front light component 1414 may illuminate display 1402. If the cover is closed, meanwhile, front light component 1414 may receive a signal indicating that the cover has closed and, in response, front light component 1414 may turn off.

Furthermore, the amount of light emitted by front light component 1414 may vary. For instance, upon a user opening the cover, the light from the front light may gradually increase to its full illumination. In some instances, electronic device 1400 includes an ambient light sensor (not illustrated in FIG. 9) and the amount of illumination of front light component 1414 may be based at least in part on the amount of ambient light detected by the ambient light sensor. For example, front light component 1414 may be dimmer if the ambient light sensor detects relatively little ambient light, such as in a dark room; may be brighter if the ambient light sensor detects ambient light within a particular range; and may be dimmer or turned off if the ambient light sensor detects a relatively large amount of ambient light, such as direct sunlight.

In addition, the settings of display 1402 may vary depending on whether front light component 1414 is on or off, or based on the amount of light provided by front light component 1414. For instance, electronic device 1400 may implement a larger default font or a greater contrast when the light is off compared to when the light is on. In some embodiments, electronic device 1400 maintains, if the light is on, a contrast ratio for display 1402 that is within a certain defined percentage of the contrast ratio if the light is off.

As described above, touch sensor component 1406 may comprise a capacitive touch sensor that resides atop display 1402. In some examples, touch sensor component 1406 may be formed on or integrated with cover layer component 1416. In other examples, touch sensor component 1406 may be a separate component in the stack of the display assembly. Front light component 1414 may reside atop or below touch sensor component 1406. In some instances, either touch sensor component 1406 or front light component 1414 is coupled to a top surface of a protective sheet 1426 of display 1402. As one example, front light component 1414 may include a lightguide sheet and a light source (not illustrated in FIG. 9). The lightguide sheet may comprise a substrate (e.g., a transparent thermoplastic such as PMMA or other acrylic), a layer of lacquer and multiple grating elements formed in the layer of lacquer that function to propagate light from the light source towards display 1402; thus, illuminating display 1402.

Cover layer component 1416 may include a transparent substrate or sheet having an outer layer that functions to reduce at least one of glare or reflection of ambient light incident on electronic device 1400. In some instances, cover layer component 1416 may comprise a hard-coated polyester and/or polycarbonate film, including a base polyester or a polycarbonate, that results in a chemically bonded UV-cured hard surface coating that is scratch resistant. In some instances, the film may be manufactured with additives such that the resulting film includes a hardness rating that is greater than a predefined threshold (e.g., at least a hardness rating that is resistant to a $3h$ pencil). Without such scratch resistance, a device may be more easily scratched and a user may perceive the scratches from the light that is dispersed over the top of the reflective display. In some examples, protective sheet 1426 may include a similar UV-cured hard coating on the outer surface. Cover layer component 1416 may couple to another component or to protective sheet 1426 of display 1402. Cover layer component 1416 may, in some instances, also include a UV filter, a UV-absorbing dye, or the like, for protecting components lower in the stack from UV light incident on electronic device 1400. In still other examples, cover layer component 1416 may include a sheet of high-strength glass having an antiglare and/or antireflective coating.

Display 1402 includes protective sheet 1426 overlying an image-displaying component 1428. For example, display 1402 may be preassembled to have protective sheet 1426 as an outer surface on the upper or image-viewing side of display 1402. Accordingly, protective sheet 1426 may be integral with and may overlay image-displaying component 1428. Protective sheet 1426 may be optically transparent to enable a user to view, through protective sheet 1426, an image presented on image-displaying component 1428 of display 1402.

In some examples, protective sheet 1426 may be a transparent polymer film in the range of 25 to 200 micrometers in thickness. As several examples, protective sheet 1426 may be a transparent polyester, such as polyethylene terephthalate (PET) or polyethylene naphthalate (PEN), or other suitable transparent polymer film or sheet, such as a polycarbonate or an acrylic. In some examples, the outer surface of protective sheet 1426 may include a coating, such as the hard coating described above. For instance, the hard coating may be applied to the outer surface of protective sheet 1426 before or after assembly of protective sheet 1426 with image-displaying component 1428 of display 1402. In some examples, the hard coating may include a photoinitiator or other reactive species in its composition, such as for curing the hard coating on protective sheet 1426. Furthermore, in some examples, protective sheet 1426 may be dyed with a UV-light-absorbing dye, or may be treated with other UV-absorbing treatment. For example, protective sheet 1426 may be treated to have a specified UV cutoff such that UV light below a cutoff or threshold wavelength is at least partially absorbed by protective sheet 1426, thereby protecting image-displaying component 1428 from UV light.

According to some embodiments herein, one or more of the components discussed above may be coupled to display 1402 using fluid optically-clear adhesive (LOCA). For example, the lightguide portion of front light component 1414 may be coupled to display 1402 by placing LOCA on the outer or upper surface of protective sheet 1426. If the LOCA reaches the corner(s) and/or at least a portion of the perimeter of protective sheet 1426, UV-curing may be performed on the LOCA at the corners and/or the portion of the perimeter. Thereafter, the remaining LOCA may be UV-cured and front light component 1414 may be coupled to the LOCA. By first curing the corner(s) and/or the perimeter, the techniques effectively create a barrier for the remaining LOCA and also prevent the formation of air gaps in the LOCA layer, thereby increasing the efficacy of front light component 1414. In other embodiments, the LOCA may be placed near a center of protective sheet 1426, and pressed outwards towards a perimeter of the top surface of protective sheet 1426 by placing front light component 1414 on top of the LOCA. The LOCA may then be cured by directing UV light through front light component 1414. As discussed above, and as discussed additionally below, various techniques, such as surface treatment of the protective sheet, may be used to prevent discoloration of the LOCA and/or protective sheet 1426.

While FIG. 9 illustrates a few example components, electronic device 1400 may have additional features or functionality. For example, electronic device 1400 may also include additional data storage devices (removable and/or non-removable) such as, for example, magnetic disks, optical disks, or tape. The additional data storage media, which may reside in a control board, may include volatile and nonvolatile, removable and non-removable media implemented in any method or technology for storage of information, such as computer readable instructions, data structures, program modules, or other data. In addition, some or all of the functionality described as residing within electronic device 1400 may reside remotely from electronic device 1400 in some implementations. In these implementations, electronic device 1400 may utilize communication interfaces 1418 to communicate with and utilize this functionality.

In an embodiment, an electrowetting display device includes a first support plate, and a plurality of pixel walls on the first support plate. The plurality of pixel walls are associated with an electrowetting pixel. The device includes a pixel electrode on the first support plate for applying a voltage within the electrowetting pixel to cause relative displacement of an oil within the electrowetting pixel to modify a reflectance of the electrowetting pixel, a second support plate over the first support plate, and an organic layer on the second support plate. The device includes an electrode layer on the organic layer. The electrode layer is patterned to include an opening. The device includes a pixel spacer coupled to the second support plate. The pixel spacer includes a first portion in direct contact with the organic layer through the opening in the electrode layer. The pixel spacer is in contact with at least one pixel wall in the plurality of pixel walls.

In another embodiment a device includes a first support plate including a pixel wall associated with a pixel, a second support plate over the first support plate, and an electrode layer on the second support plate. The electrode layer is patterned to include an opening. The device includes a pixel spacer coupled to the second support plate through the opening in the electrode layer.

In another embodiment, a device includes a first support plate including a pixel wall associated with a pixel, a second support plate over the first support plate, and an organic layer on the second support plate. The device includes a pixel spacer in contact with the pixel wall, the pixel spacer being directly connected to the organic layer on the second support plate.

Although the subject matter has been described in language specific to structural features and/or methodological acts, it is to be understood that the subject matter defined in the appended claims is not necessarily limited to the specific features or acts described. Rather, the specific features and acts are disclosed as illustrative forms of implementing the claims.

One skilled in the art will realize that a virtually unlimited number of variations to the above descriptions are possible, and that the examples and the accompanying figures are merely to illustrate one or more examples of implementations.

It will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular embodiments disclosed, but that such claimed subject matter may also include all embodiments falling within the scope of the appended claims, and equivalents thereof.

In the detailed description above, numerous specific details are set forth to provide a thorough understanding of claimed subject matter. However, it will be understood by those skilled in the art that claimed subject matter may be practiced without these specific details. In other instances, methods, apparatuses, or systems that would be known by one of ordinary skill have not been described in detail so as not to obscure claimed subject matter.

Reference throughout this specification to "one embodiment" or "an embodiment" may mean that a particular feature, structure, or characteristic described in connection with a particular embodiment may be included in at least one embodiment of claimed subject matter. Thus, appearances of the phrase "in one embodiment" or "an embodiment" in various places throughout this specification is not necessarily intended to refer to the same embodiment or to any one particular embodiment described. Furthermore, it is to be understood that particular features, structures, or characteristics described may be combined in various ways in one or more embodiments. In general, of course, these and other issues may vary with the particular context of usage. Therefore, the particular context of the description or the usage of these terms may provide helpful guidance regarding inferences to be drawn for that context.

What is claimed is:

1. An electrowetting display device, comprising:
   a first support plate;
   a plurality of pixel walls on the first support plate, the plurality of pixel walls being associated with an electrowetting pixel;
   a pixel electrode on the first support plate for applying a voltage within the electrowetting pixel to cause relative displacement of an oil within the electrowetting pixel to modify a reflectance of the electrowetting pixel;
   a second support plate over the first support plate;
   an organic layer on the second support plate;
   an electrode layer on the organic layer, the electrode layer being patterned to include an opening; and
   a pixel spacer coupled to the second support plate, the pixel spacer including a first portion in direct contact with the organic layer through the opening in the electrode layer, and wherein the pixel spacer is in contact with at least one pixel wall in the plurality of pixel walls.

2. The electrowetting display device of claim 1, wherein the pixel spacer is not in contact with the electrode layer.

3. The electrowetting display device of claim 1, wherein the electrode layer is patterned to include a second opening and the pixel spacer includes a second portion, the second portion of the pixel spacer being in direct contact with the organic layer through the second opening in the electrode layer.

4. A device, comprising:
   a first support plate including a pixel wall associated with a pixel;
   a second support plate over the first support plate;
   an electrode layer on the second support plate, the electrode layer being patterned to include an opening; and
   a pixel spacer coupled to the second support plate through the opening in the electrode layer.

5. The device of claim 4, further comprising an organic layer on the second support plate between the second support plate and the electrode layer and wherein the pixel spacer is in direct contact with the organic layer through the opening in the electrode layer.

6. The device of claim 4, wherein the pixel spacer does not contact the electrode layer.

7. The device of claim 4, wherein a minimum distance between a surface of the pixel spacer and the electrode layer is at least three microns.

8. The device of claim 4, wherein the electrode layer is patterned to include a second opening and the pixel spacer is directly connected to the second support plate through the second opening in the electrode layer.

9. The device of claim 8, wherein the pixel spacer includes:
   a first portion coupled to the second support plate through the opening in the electrode layer; and
   a second portion coupled to the second support plate through the second opening in the electrode layer.

10. The device of claim 4, wherein the electrode layer includes indium tin oxide, a conductive polymer, graphene, or carbon nanotubes.

11. The device of claim 4, wherein the first support plate includes a second pixel wall associated with a second pixel and the electrode layer forms a common electrode of the pixel and the second pixel.

12. The device of claim 4, wherein the second support plate includes a black matrix member and the pixel spacer is connected to the second support plate over the black matrix member.

13. The device of claim 4, further comprising a second electrode layer over first support plate, the second electrode layer including a pixel electrode coupled to the electrode layer to apply a driving voltage to the pixel.

14. The device of claim 4, wherein the second support plate is coupled to the first support plate and the pixel spacer is in contact with a top surface of the pixel wall.

15. The device of claim 4, wherein a ratio of a height of the pixel spacer to a thickness of the electrode layer is at least 75.

16. A device, comprising:
   a first support plate including a pixel wall associated with a pixel;
   a second support plate over the first support plate;
   an organic layer on the second support plate;

an electrode layer on the organic layer, wherein the organic layer is between the electrode layer and the second support plate; and a pixel spacer in contact with the pixel wall, the pixel spacer being directly connected to the organic layer.

17. The device of claim 16, wherein the electrode layer is patterned to include an opening, and wherein a first portion of the pixel spacer is directly connected to the organic layer through the opening in the electrode layer.

18. The device of claim 17, wherein the pixel spacer does not contact the electrode layer.

19. The device of claim 17, wherein a minimum distance between a surface of the pixel spacer and the electrode layer is at least three microns.

20. The device of claim 17, wherein the electrode layer is patterned to include a second opening and a second portion of the pixel spacer is directly connected to the organic layer through the second opening in the electrode layer.

* * * * *